United States Patent [19]

Ota et al.

[11] Patent Number: 5,409,544
[45] Date of Patent: Apr. 25, 1995

[54] METHOD OF CONTROLLING ADHESION OF FINE PARTICLES TO AN OBJECT IN LIQUID

[75] Inventors: Katsuhiro Ota; Akio Saito; Yoichi Takahara; Hitoshi Oka, all of Yokohama, Japan

[73] Assignee: Hitachi, Ltd., Tokyo, Japan

[21] Appl. No.: 117,652

[22] Filed: Sep. 8, 1993

Related U.S. Application Data

[63] Continuation of Ser. No. 747,851, Aug. 20, 1991, abandoned.

[30] Foreign Application Priority Data

Aug. 20, 1990 [JP] Japan .................. 2-219710

[51] Int. Cl.$^6$ .......................... B08B 9/00
[52] U.S. Cl. .................. 134/22.14; 134/22.19; 134/902; 437/946; 148/DIG. 17
[58] Field of Search .............. 134/22.14, 22.19, 29–33, 134/902; 437/946; 156/638

[56] References Cited

U.S. PATENT DOCUMENTS

| | | | |
|---|---|---|---|
| 4,129,457 | 12/1978 | Basi | 134/2 |
| 4,239,661 | 12/1980 | Muraoka et al. | 252/541 |
| 4,968,381 | 11/1990 | Prigge et al. | 156/636 |
| 5,078,801 | 1/1992 | Malik | 437/946 |
| 5,078,832 | 1/1992 | Tanaka | 156/639 |
| 5,203,927 | 4/1993 | Yoshida et al. | 134/22.14 |

FOREIGN PATENT DOCUMENTS

63-54734 10/1988 Japan .................. 437/946
3-74845 3/1991 Japan .

OTHER PUBLICATIONS

RCA Review, Jun. 1970, Werner Kern, et al. "Cleaning solutions based on hydrogen peroxide for use in silicon semi-conductor Technology".

Saito et al "Particle Deposition Mechanism Onto Si Wafer" in Extended Abstracts for the 21st Conference on Solid State Devices and Materials, Aug. 28–30, 1989, pp. 409–412.

Saito et al "Particle Deposition Mechanism Onto Si Wafer" in Microcontamination Conference Proceedings, Oct. 16–18, 1991, pp. 562–569.

Saito et al "Novel Method For Prevention of Particle Deposition in Wet LSI Processes" Electrochemical Society Extended Abstracts vol. 19–1, May 5–10, 1991, pp. 571–572 and pp. 749–754.

*Primary Examiner*—Olik Chaudhuri
*Assistant Examiner*—H. Jey Tsai
*Attorney, Agent, or Firm*—Antonelli, Terry, Stout & Kraus

[57] ABSTRACT

A method of controlling the adhesion of fine particles to an object in a solution characterized in that the adhesion of fine particles in the solution is prevented or reduced by adding into the solution a material, which is capable of controlling the zeta potential (surface potential) of the fine particles, in the amount of $10^{-7}$ to 25% by volume.

11 Claims, 14 Drawing Sheets

R IS $-(CH_2)_n-OR-(CH_2CH_2O)_m-$
WHEREIN n AND m ARE
INTEGERS OF ABOUT 5 TO 20

R IS $-(CH_2)_n-OR-(CH_2CH_2O)_m-$
WHEREIN n AND m ARE
INTEGERS OF ABOUT 5 TO 20

IMMERSION PERIOD OF TIME (MIN.)

METHOD OF CONTROLLING ADHESION OF FINE PARTICLES TO AN OBJECT IN LIQUID

This application is a continuation of application Ser. No. 07/747,851, filed Aug. 20, 1991, was abandoned.

BACKGROUND OF THE INVENTION

1. Field of the Invention

The present invention relates to a technique to prevent or reduce the adhesion of fine particles to the surface of a semiconductor substrate such as a semiconductor wafer during a process for manufacturing semiconductor devices.

2. Description of the Related Art

The level of integration in integrated circuits formed on the surface of a substrate such as a semiconductor wafer has been recently increasing. The line width of patterns has correspondingly become finer. The minimum fabrication size is 0.5 μm in the next generation of 16 Mbit DRAM. It is considered that very small particles deteriorate the quality of the products and lower the yield of products in the manufacturing process.

Conventional techniques used to wash the surface of a substrate include a method of immersing a wafer into a mixture of ammonia water and hydrogen peroxide water, which is heated to about 80° C. and a method of applying ultrasonic waves in ultrapure water as is described in RCA Review, 31 (1970) p. 187 to 206. Particularly, the latter ultrasonic washing method has been put to practical use by applying various modifications such as the use of 850 KHz ultrasonic waves in lieu of the more conventional 50 KHz ultrasonic waves as is described in J. Elec. Materials, 8 (1979) p. 855 to 864, changing the distance between an ultrasonic emitting surface and the surface top of the liquid as is described in Japanese Unexamined Patent Publication No. Sho 60-187380 and frequency-modulating a basic frequency as is described in Japanese Unexamined Patent Publication No. Sho 61-101283.

The minimum fabrication size in 16 Mbit DRAM is 0.5 μm due an advancement in the level of integration in integration circuits. The particles of foreign matter which are to be washed away have correspondingly become smaller. It is considered that even particles of foreign matter as small as 0.05 μm should be removed.

As the foreign matter particles to be considered become smaller, there are more types of foreign matter in the air.

The number of different types of foreign matter of 0.05 μm size are twice as many as those of 0.13 μm which should be currently removed for manufacturing 4 Mbit DRAM. It is considered that as the foreign matter becomes smaller, they are more likely to adhere to substrates. A technique for washing away very small particles of foreign matter has been increasingly in demand.

However, the physical energy applied upon one particle of foreign matter becomes smaller so that it is more difficult to remove the foreign matter from the substrate in accordance with conventional removal methods, for example, by applying a physical energy by ultrasonic waves. Damage to the substrate has become serious in association with an improvement in the level of integration of semiconductor devices. Accordingly, it is considered that it is difficult for conventional methods to remove very small particles of foreign matter.

The present invention was made under such circumstances.

It is an abject of the present invention to provide a technique to prevent or reduce the adhesion of fine particles to a substrate.

SUMMARY OF THE INVENTION

In order to accomplish the above mentioned object, the present invention provides a method of controlling the adhesion of fine particles to an object in a solution characterized in that adhesion of fine particles in the solution is prevented or reduced by adding into the solution a material which is capable of controlling the zeta potential (surface potential) of the fine particles in the amount of between $10^{-7}$ and 25% by volume.

FIGS. 1(a) to 1(c) show the concept of the present invention, FIG. 1(a) is a graph showing the relation between the distance (Å) between a substrate and particles and the potential energy (W), FIG. 1(b) is a schematic view showing the electrostatic repulsive force established by electric double layers formed by surface charges 3 between a substrate 1 and particles 2, FIG. 1(c) is a schematic view showing an attractive force due to van der Waals force established between the substrate 1 and the particles 2.

As shown in FIG. 1(a), the potential energy W between the substrate 1 and particles 2 is expressed as the sum of two potentials such as an attractive force (VA) due to van der Waals force and an electrostatic repulsive force (VR) due to electric double layers (W=VA+VR). It is considered that the fine particles adhere to the substrate by exceeding this peak of the potential. In order to reduce adhesion of the fine particles to the substrate, the present invention contemplates increasing the surface potential (zeta potential) to increase the electrostatic repulsive force. The relationship between the amount of fine particles adhered to the substrate and the zeta potential of the fine particles is shown in FIG. 2. In FIG. 2, reference numeral 4 represents silicon (Si) particles which are treated with hydrofluoric acid (HF:H$_2$O=1:99) by immersion therein; 5 untreated silicon particles; 6 polystyrene particles. The zeta potentials are different depending upon the kind of particles. The zeta potentials of the same silicon particles are different depending upon the kind of particles. The zeta potentials of the same silicon particles are depending on whether or not they are subjected to surface treatment so that the amount of fine particles which adheres to the substrate differs. Therefore, it is considered that adhesion of the fine particles to a substrate can be prevented or reduced by controlling the zeta potential.

Although the zeta potentials of the substrate and fine particles are generally negative, both may occasionally be positive like an alumina substrate and fine particles of alumina.

The term "controlling the zeta potential" used herein means increasing the absolute value.

The present invention was made based upon the finding that the zeta potential of fine particles or a substrate can be controlled by adding a given material into a solution.

It is considered that water molecules in a liquid adhere to the periphery of the fine particles in several layers and migrate when the fine particles migrate in the liquid to adhere to a semiconductor substrate and the like. The interface is referred to as the "slip plane (shear plane)". The potential of this surface is related to the adhesion of the fine particles as mentioned above. For the details of the slip plane, refer to "Chemistry of dispersion and emulsion system" page 102 written by Fumio Kitahara and published by Kogaku Tosho, 1979. Since the zeta potential is measured by an electrophoresis, measuring the zeta potential is just the measuring of the potential of the slip plane. The details of the measurement of the zeta potential will be described in the description of the Examples in this specification.

It has been found in the present invention that it is effective to add materials such as aldehydes, ketones, alcohols, glycols, organic acids, esters, amines, amino alcohols, or nonionic surface active agents as a material which is capable of controlling the zeta potential, or potential of the slip plane. These materials have a non-uniform distribution of charges in the molecules. Some portions are slightly positively charged while other portions are slightly negatively charged so that the whole of the material has a neutral charge. In other words, these materials have a dipole moment. It is considered that addition of these materials changes the zeta potential of the fine particles due to the non-uniformity of the charge distribution. For example, the values of the zeta potentials are different if various alcohols are used. This can be semiquantitatively explained by the non-uniformity of the charge distribution in the molecule as follows: FIG. 3a shows the zeta potential and the charge distribution in a molecule of alcohol which are theoretically calculated in accordance with the non-empirical molecular orbit method based upon quantum mechanics. The adhesion condition of the fine particles 2 to alcohol includes a case shown in FIG. 3(a). It is found that if the slip plane is assumed to be positioned in the 3rd to 4th atom layer from the surface of the fine particles 2 as in the case shown in FIG. 3(a), the absolute value of the zeta potential becomes larger as the absolute value of the charges of the carbon atoms located in the vicinity thereof gets larger. That is, it can be considered that when a molecule of alcohol adheres to a particle, the distribution of a local charge existing in the vicinity of an atom which is the 3rd to 4th atom from the adhered end influences the value of the zeta potential. On the other hand, when the relationship between the position of an oxygen atom having a large negative charge and the slip plane is different the absolute value of the zeta potential increases as the oxygen atom gets closer to the slip plane. Therefore, it can be inferred that the magnitude of the zeta potential is determined by the non-uniformity of the charge distribution in the molecule in both cases.

It is essential that the materials which are capable of controlling the zeta potential be adhered to a substrate or fine particles. The materials have a common feature in that they have hydrophilic group such as OH, CHO, COOH or $NH_2$ and a hydrophobic group such as a hydrocarbon group or a portion including hydrocarbon. It can be considered that adhesion of these materials to a substrate or foreign matter particles (fine particles) takes place.

All of the materials which are capable of controlling the zeta potential are reluctant to be ionized. If a material which is easily ionized is added to a solution, the ionic strength in the solution increases so that adhesion of foreign matter particles easily occurs. That is, even if the zeta potential is increased, the prevention of the foreign matter adhesion may not be sufficient. Accordingly, used of a material which is difficult to be ionize is very preferable in accomplishing the object of the present invention.

Accordingly, it can be understood that a material which is difficult to ionize and has hydrophilic and hydrophobic groups in one molecule is effective in the control of the zeta potential. However, the zeta potential control effect varies depending upon the combination of the charge distribution in the molecule with the slip plane. That is, it can be readily understood that such a material is one in which the charge distribution of any one or all of the 2nd to the 6th atoms of a hydrophobic group from the end adhered to a particle is negative: specifically, the atoms of the material have a high electronegativity such as oxygen and halogen atoms and an atomic group bonding thereto is an electron emissive group or an atom having a high electronegativity. It is also effective to combine a plurality of materials.

FIG. 4 is a schematic view showing that molecules of two or more kinds of alcohols or nonionic surface active agents having different molecular lengths adhere to the surface of a fine particle. As shown in FIG. 4, if R—R—R—R—OH and R—R—R—OH having different molecular lengths wherein if R represents —($CH_2$)n—, the material is an alcohol and if R represents a combination of —($CH_2CH_2O$)m— —($CH_2$)n— with —($CH_2CH_2O$)m— the material is a nonionic surface active agent wherein n and m are integers of about 5 to 20, are adhered to the surface of the fine particles, the terminals of the shorter molecules which are adhered in a close manner form pseudo particle surfaces.

FIG. 5(a) is a schematic view showing that a nonionic surface active agent and an alcohol which are mixingly added adhere to the surface of the fine particles. FIG. 5(b) and 5(c) are schematic views showing that an alcohol having a long molecular chain or a nonionic surface active agent and an amino-alcohol which are mixingly added adhere to the surface of the fine particles.

In FIGS. 5(a) to 5(c), R is the same as that in FIG. 4. If a combination of an alcohol having a long molecular chain or a nonionic surface active agent is mixed with an alcohol having a short molecular chain or an amino alcohol and used in such a manner, the zeta potential changes since the alcohol or amino alcohol having a low molecular weight will adhere to the hydrophobic group of the alcohol having a long molecular chain and the nonionic surface active agent. Since the amount of adsorbed organic solvent increases when specific kinds of foreign matter are used, a change in the zeta potential will further increase. Accordingly, a remarkable success in preventing the particle adhesion can be achieved. Materials which exhibit this remarkable effect by combination with the alcohol having a long molecular chain or the nonionic surface active agent include materials having hydrophilic and hydrophobic groups in one molecule such as aldehydes, ketones, amines, glycols, organic acids, asters other than the above mentioned materials.

The amount of the above mentioned material to be added is generally from $10^{-7}$ to 25% by volume depending on its kind. It is effective to add not less than $10^{-7}$% by volume of the material. It is not effective to add more than 25% by volume of the material. It is most preferable to add 0.1 to 2.5% by volume of alcohol, $10^{-7}$ to $10^{-1}$ % by volume of amino alcohol, 0.001 to 0.1% by volume of organic acid, 0.1 to 3.5% by volume of aldehyde, 0.1 to 3.0% by volume of ketone.

In accordance with the present invention, a material which is capable of controlling the zeta potential is added to a solution to increase the absolute value of the zeta potential of fine particles (foreign matter) in the solution. This increases the electrostatic repulsive forces between the fine particles and an object to which the particles adhere (for example, a semiconductor substrate) in the solution. As a result of this, the potential energy between the fine particles and the object increases so that the adhesion of the fine particles to the object can be prevented or reduced.

BRIEF DESCRIPTION OF THE DRAWINGS

FIG. 1(a) is a graph showing the relation between the distance (Å) between a substrate and particles and the potential energy (W);

FIG. 1(b) is a schematic view showing the electrostatic repulsive force established by electric double layers formed by surface charges 3 between a substrate 1 and particles 2;

FIG. 1(c) is a schematic view showing an attractive force due to van der Waals force established between the substrate 1 and the particles 2;

DESCRIPTION OF THE PREFERRED EMBODIMENTS

The method of measuring the zeta potential will be firstly described. The zeta potential can usually be determined by the electrophoresis. Electrophoresis is a phenomenon where fine particles having surface charges migrate in a liquid when an electrostatic field is established in the liquid. The zeta potential of the particles, which has a proportional relationship with the migration speed can be determined by measuring the migration speed of the particles. The measurement of the zeta potential of the fine particles was carried out by using a potential measuring instrument (LASER ZEE model 501 manufactured by Pen Kem) relying on this principle in the present invention.

Polystyrene standard particles, $SiO_2$ particles, Fe particles and Si particles were used in order to confirm the effects of the present invention. The reason why these particles are used is merely the ready availability of the particles having an uniform diameter. It is to be understood that the kinds of the particles are not limited to the fore-going particles and that the effects of the present invention are not limited.

Polystyrene standard particles having a diameter of 1.0 to 0.038 μm manufactured by Dow Chemical Co., Ltd. were used. $SiO_2$ particles, Fe particles and Si particles having a diameter of approximately 1.0 μm manufactured by Kohjundo Kagaku K.K. were used. Si particles used in the experiment include unpretreated particles and particles which have been treated by immersion in a mixture including hydrofluoric acid and ultrapure water at a ratio of 1:99.

It is considered that the value of the zeta potential does not depend upon the diameter of the particles. Accordingly, the measurement data obtained at the fore-going particle diameter can be directly used for the fine particles of approximately 0.05 μm.

EXAMPLE 1

Figure 6:
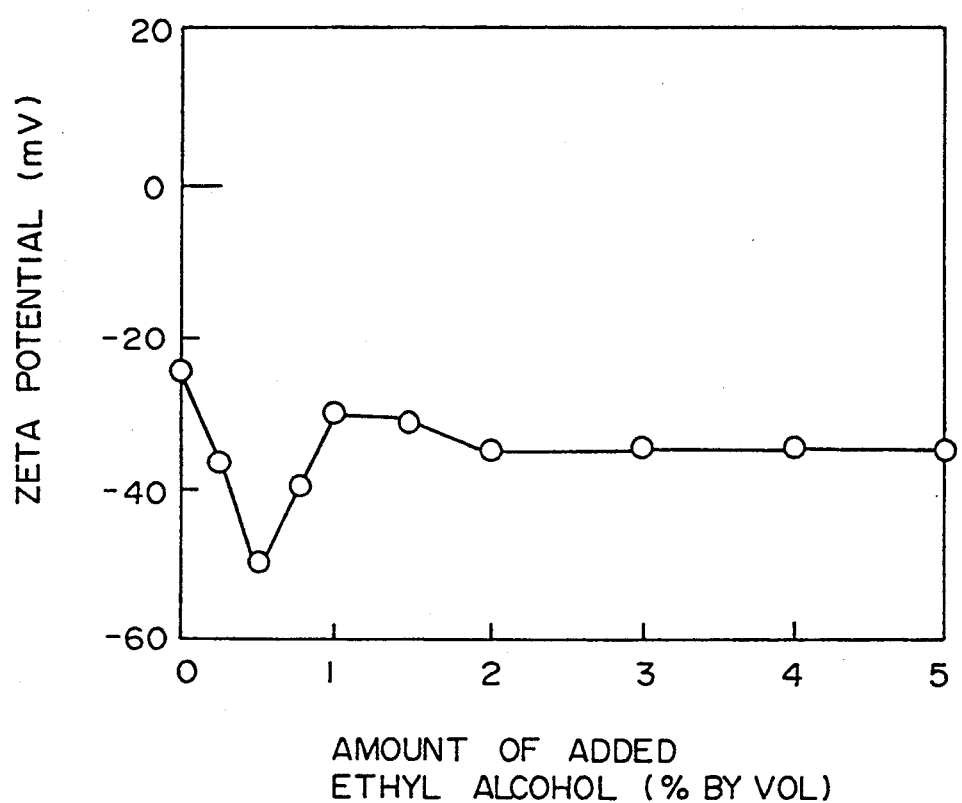
FIGS. 6, 7 and 8 are graphs showing the relation between the amount of added ethyl alcohol and the zeta potential of fine particles and the relation between the amount of added monoethanolamine and the zeta potential of fine particles and the relation between the amount of added monoisopropanolamine and the zeta potential of fine particles, respectively.

The zeta potential control effect of a material which is unlike to be ionized and has hydrophilic and hydrophobic groups is shown in Table 1. It has been confirmed that various materials such as aldehydes, ketones, alcohols, esters, and organic acids have the zeta potential control effect. In this case, Si particles which had been treated with hydrofluoric acid were added with ethyl alcohol to show a relation between the amount of addition and the zeta potential control effect. The relation between the concentration of the ethyl alcohol and the changes in the zeta potential of the Si particles is shown in FIG. 6. The Si particles have a zeta potential of −23.7 mV prior to addition of the ethyl alcohol. The zeta potential of the Si particles could be controlled to −50.1 mV by the addition of 0.5% by volume of ethyl alcohol. (Although not shown in the drawing, the effect could be maintained until the concentration of the added ethyl alcohol was increased to 25% by volume (20% by weight)). The amount of the added ethyl alcohol at which the zeta potential is minimized depends upon the kind of the materials. Tendencies which were similar to that in FIG. 6 were obtained for materials other than ethyl alcohol. The addition amount of each of the materials which minimizes the zeta potential and the current value of the zeta potential are shown in Table 1.

EXAMPLE 2

Figure 1A:
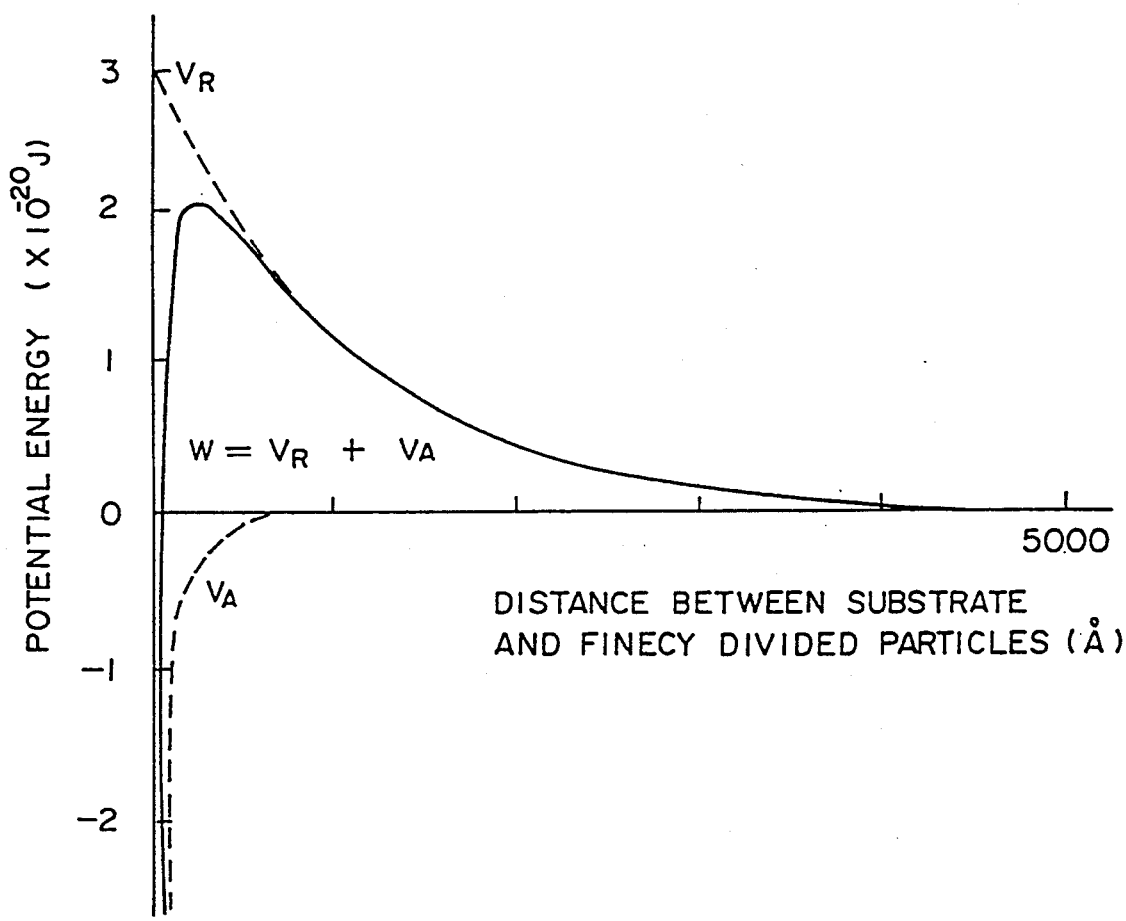
FIG. 1(a) to 1(c) show the concept of the present invention.
Figure 1B:
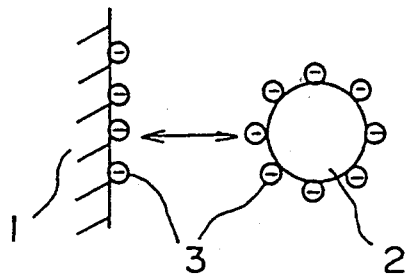
Figure 1C:
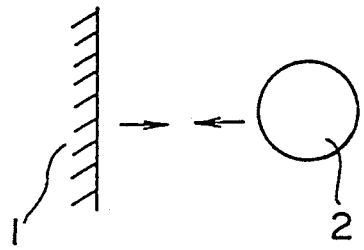
Figure 2:
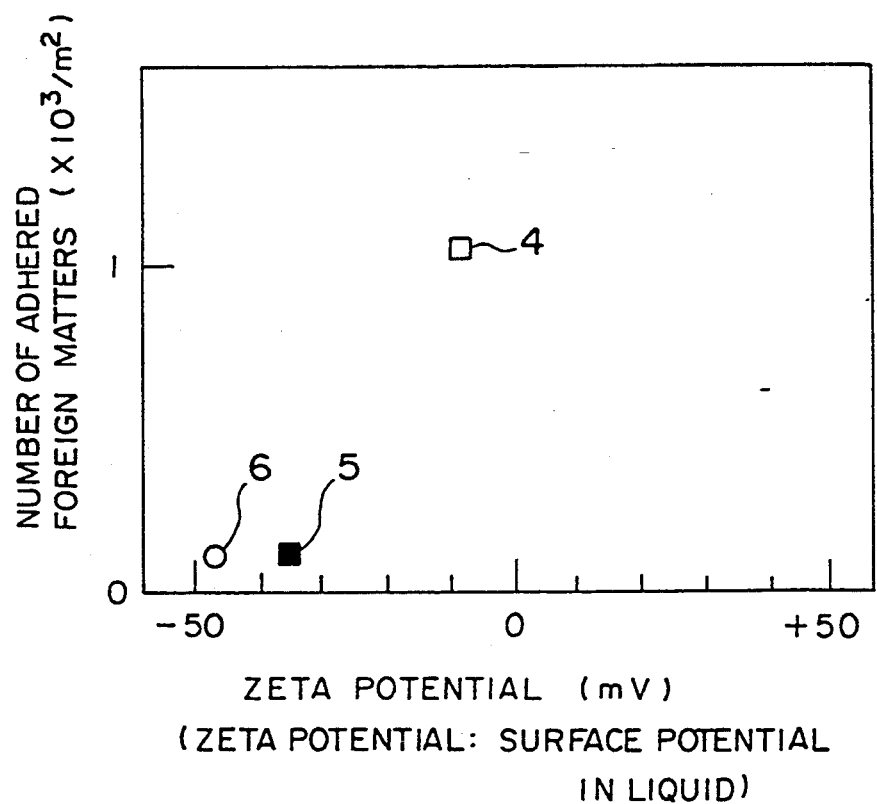
FIG. 2 is a graph showing the relation between the zeta potential of fine particles and the number of foreign materials adhered to the substrate (the amount of adhered fine particles)
Figure 3:
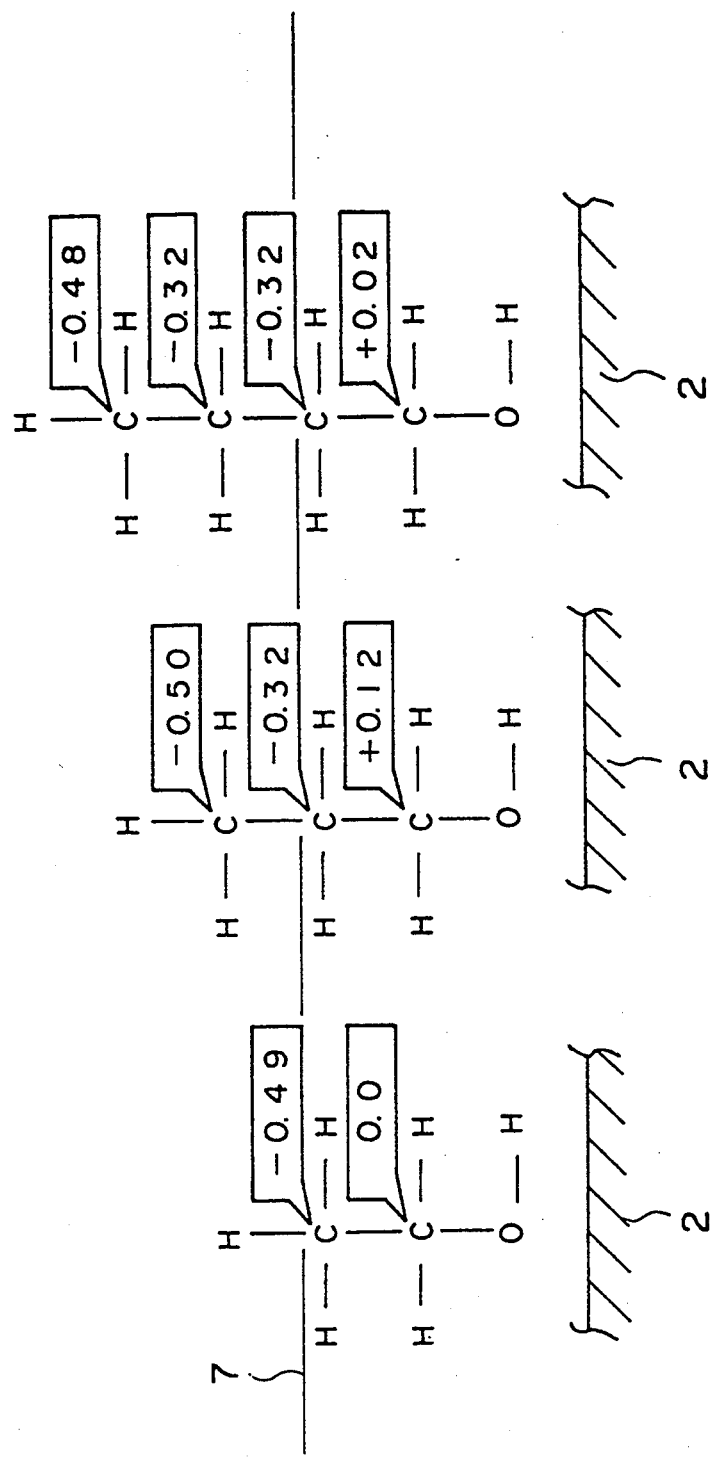
FIG. 3(a) and (b) are schematic views showing the condition adhesion of an alcohol molecule to the surface of a fine particle and the potential of a slip plane.
Figure 3:
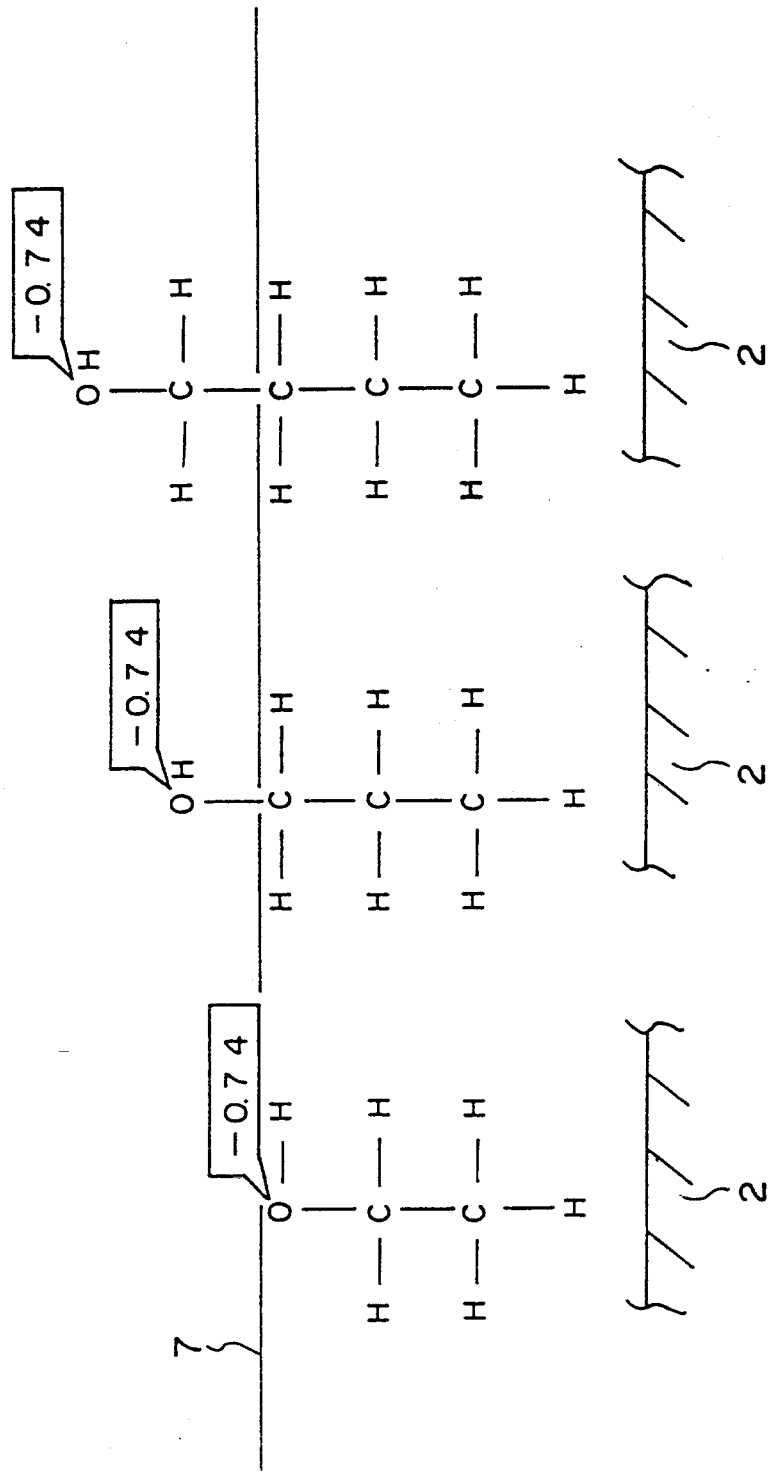
Figure 4:
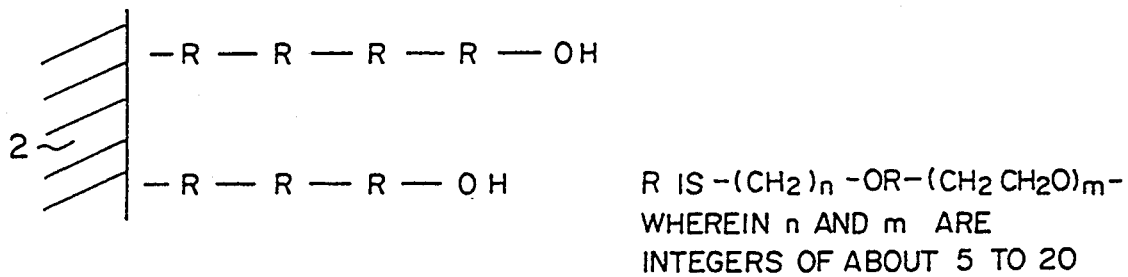
FIG. 4 is a schematic view showing that not less than two kinds of alcohol molecules or nonionic surface active agent molecules having different molecular lengths adhere to the surface of a fine particle.
Figure 5A:
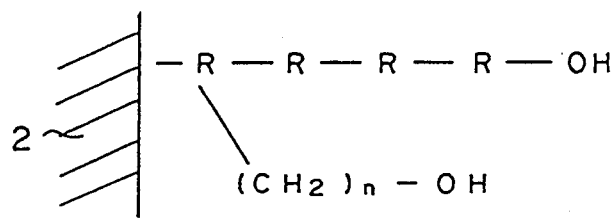
FIG. 5(a) is a schematic view showing that a nonionic surface active agent and an alcohol which are mixingly added adhere to the surface of a fine particles.
Figure 5B:
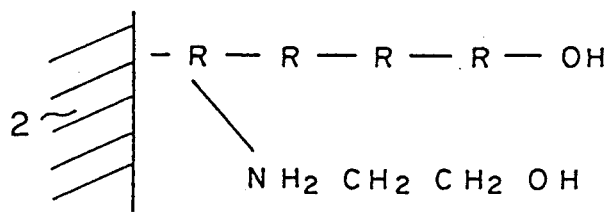
FIG. 5(b) and 5(c) are schematic views showing that a nonionic surface active agent and an amino alcohol which are mixingly added adhere to the surface of a fine particles.
Figure 5C:
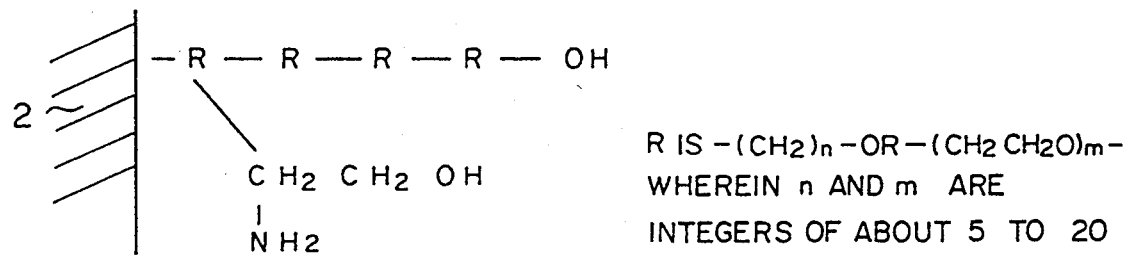
Figure 7:
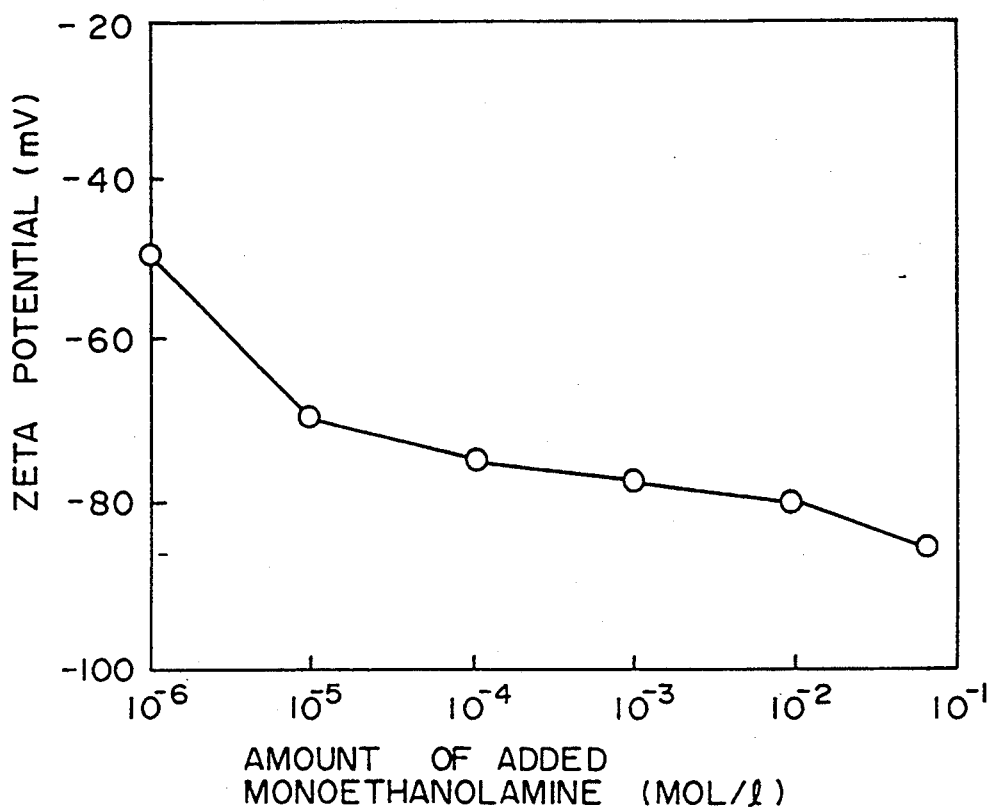
Figure 8:
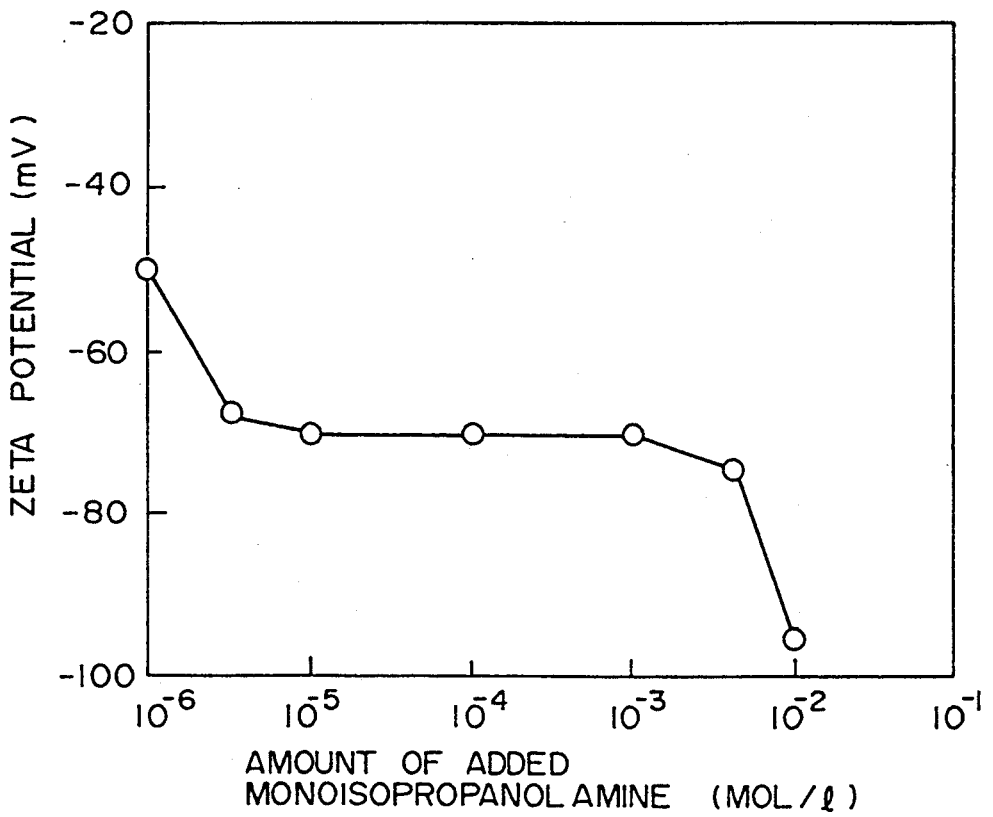

A remarkable effect was obtained by the addition of a small amount of amino alcohol. The changes in the zeta potential when various amino alcohols are added are shown in Table 2. The relation between the amount of added monoethanolamine and the zeta potential of polystyrene particles of 1 μm is shown in FIG. 7. The relation between the amount of added monoisopropanolamine and the zeta potential is shown in FIG. 8. The zeta potential rarely minimized unlike the material of FIG. 1, when amino alcohol is added. The more alcohol is added, the more the absolute value of the zeta potential becomes as shown in FIGS. 7 and 8.

Sufficient effect was obtained by the addition of not less than $10^{-7}$ mol/l ($6 \times 10^{-7}$% by weight).

EXAMPLE 3

Changes in the zeta potential when alcohol which contains halogen was added are shown in Table 3. It was found that hexafluoro2-propanol and 1H, 1H-pentafluoropropanol have a large effect upon the change in the zeta potential. Both exhibit more remarkable effects than those exhibited by materials containing no halogen.

EXAMPLE 4

A nonionic surface active agent having a general formula

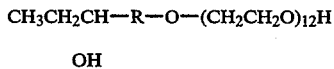

$$CH_3CH_2CH-R-O-(CH_2CH_2O)_{12}H$$
$$|$$
$$OH$$

wherein R represents $-(CH_2)n-$ and n is 5 to 20 was synthesized and its zeta potential control effect was studied. The results are shown in Table 4. It was found that this agent has an effect for various particles. It can be expected that surface active agents having similar structures have similar effects.

EXAMPLE 5

Two nonionic surface active agents I and II which are respectively represented by formulae: $CH_3(CH_2)_{11}CH_2O(CH_2CH_2O)_{12}H$ and $CH_3(CH_2)_{12}CH_2O(CH_2CH_2O)_{14}H$ which have different molecular lengths were synthesized and their zeta potential control effect was studied. The results are shown in Table 5. It was found that they have the effect for various particles. It can be expected that the combinations of the surface active agents having similar structures have similar effects.

EXAMPLE 6

An example in which a nonionic surface active agent having a structure: $CH_3(CH_2)_{10}CH_2O(CH_2CH_2O)_{12}H$ is combined with an alcohol is shown in Table 6. It was found that this combination particularly has a remarkable effect on the Si particles, $SiO_2$ particles and Fe particles which are not treated with fluoric acid, on which only alcohol otherwise has a small effect. It can be, of course, expected that alcohols other than ethanol have similar effect.

EXAMPLE 7

An example in which the synthesized nonionic surface active agent $CH_3(CH_2)_{10}CH_2O(CH_2CH_2O)_{12}H$ is combined with amino alcohol is shown in Table 7. It was found that this combination has a remarkable effect on Si particles, $SiO_2$ particles and Fe particles which are not treated with fluoric acid, on which only amino alcohol has a small effect.

EXAMPLE 8

Figure 9:
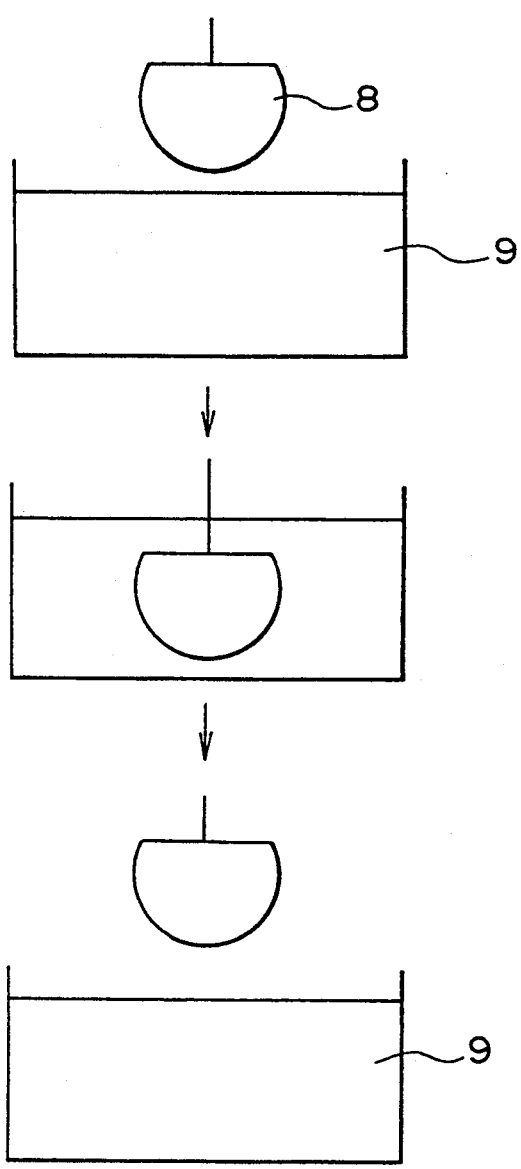
FIG. 9 is a schematic view showing a process for immersing a 4 inch Si wafer into fine particle-containing ultrapure solution and removing it therefrom.

The effect of prevention of adhesion of particles in accordance with the present invention was confirmed by the following procedure: As shown in FIG. 9, polystyrene standard particles of 0.038 μm were dispersed in ultrapure water in a liquid reservoir 9 (the concentration of the polystyrene particles was adjusted to $5 \times 10^{11}/m^3$) and a 4 inch Si wafer 8 was immersed in the liquid 9 for a given period of time. Then the wafer was pulled out from the liquid 9 and was dried by means of a spinner. The number of the polystyrene particles adhered to the wafer was measured by means of an optical or an electronic microscope (SEM). The relation between the immersion period and the number of adhered particles is represented as 10 in FIG. 10. It has been found that the amount of adhered particles increases with an increase in the immersion period. After $6 \times 10^{-5}$% by volume of monoethanolamine was added to the liquid, an experiment to measure the level of adhesion was carried out in a similar manner. The result is represented as 11 in FIG. 10. Particle adhesion was hardly seen. The amount of adhered particles was reduced to approximately one third if ethanol was added in lieu of monoethanolamine as represented by 12 in FIG. 11.

Figure 10:
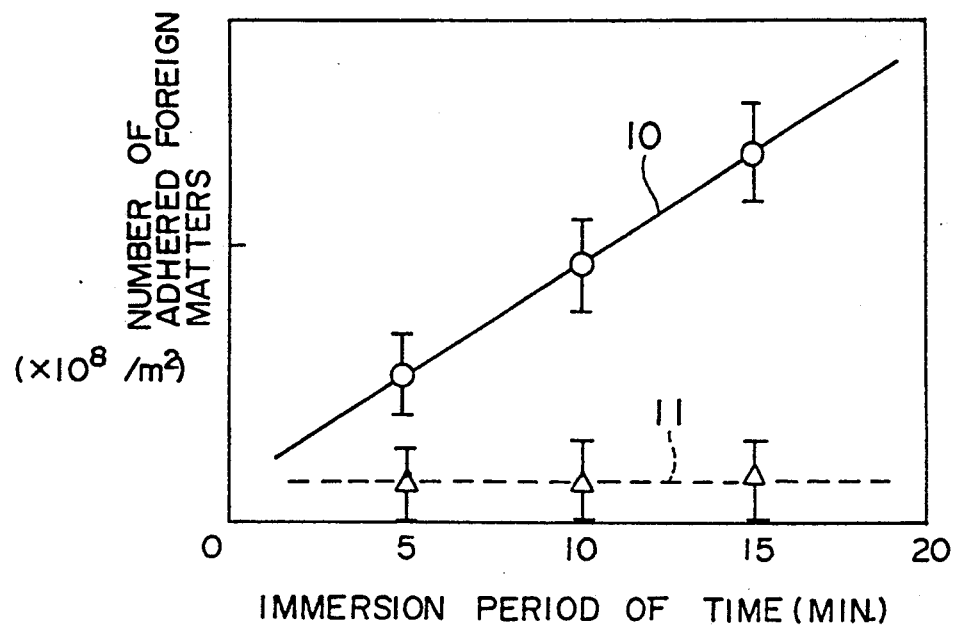
FIGS. 10 and 11 are graphs showing the relation between the period of time of immersion of a wafer and the number of adhered particles.
Figure 11:
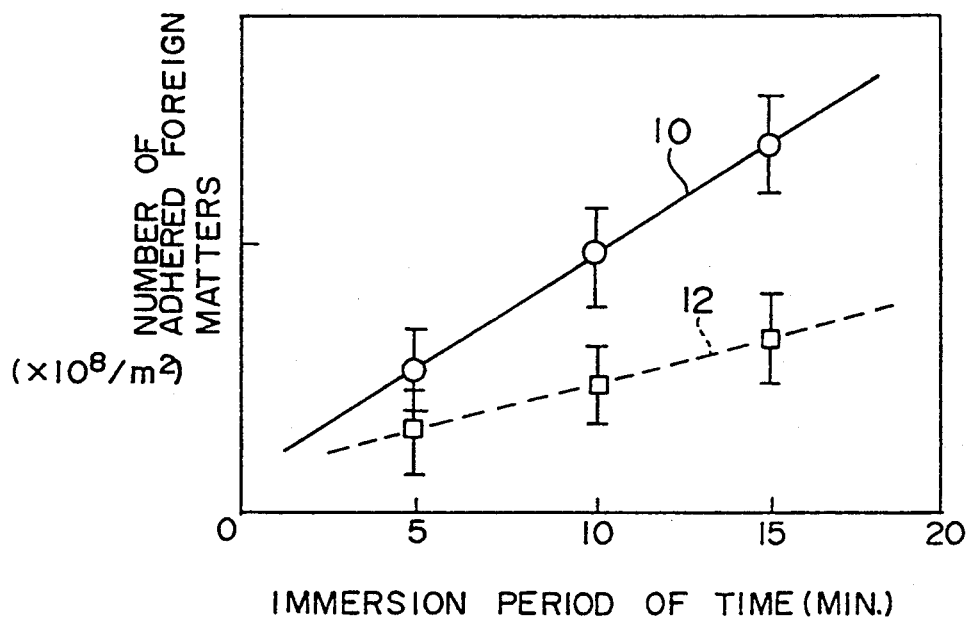

As similar adhesion experiment using polystyrene standard particles of 0.038 μm was carried out by adjusting the concentration of hydrogen ions in a liquid by the addition of chloric acid. The relation between the immersion period and the number of adhered particles at pH=3 was the same as the result in the ultrapure water and is shown in FIG. 10. That is, the number of adhered particles increased with the lapse of the immersion time and the adhesion was hardly seen by adding ($6 \times 10^{-5}$% by weight of) monoethanolamine.

Figure 12:
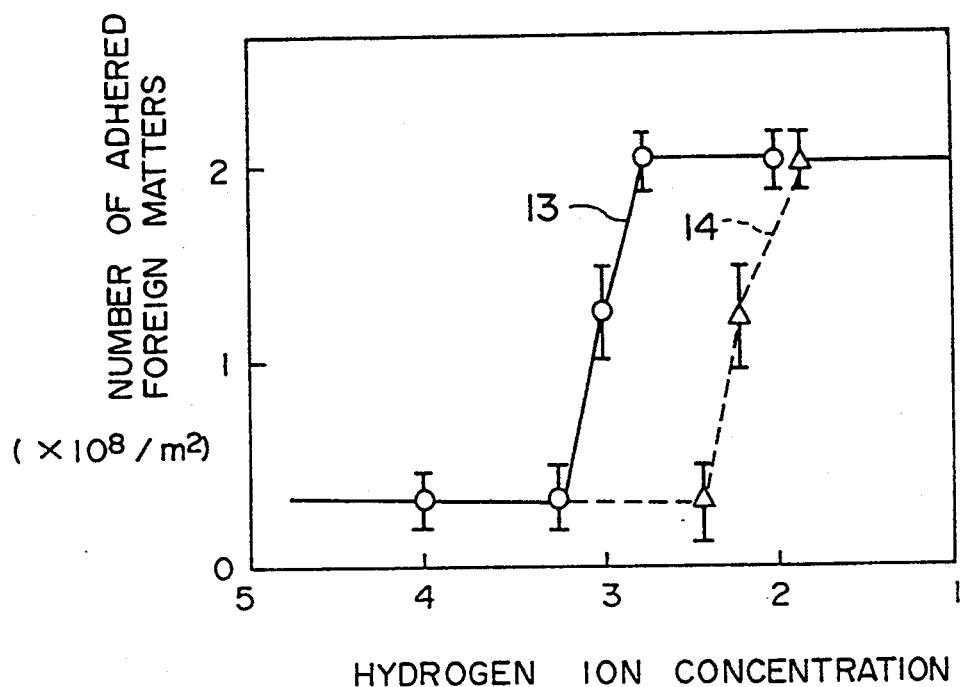
FIGS. 12 and 13 are graphs showing the hydrogen ion concentration and the number of adhered particles.

A similar adhesion experiment was carried out by using polystyrene standard particles of 0.2 μm. An optical microscope was used for measuring the number of adhered particles. Since adhesion of 0.2 μm particles was hardly seen in ultrapure water, the experiment was conducted by adding chloric acid to adjust the concentration of hydrogen ions in the solution. The concentration of the polystyrene particles was made $4 \times 10^{12}/m^3$ and the water was immersed in the liquid for 10 minutes. As the acidity exceeds bout pH 3 as shown by 13 in FIG. 12, the particles of 0.2 μm tend to adhere to the wafer. When $6 \times 10^{-5}$% by vol. of ethanolamine was added, the hydrogen ion concentration at which adhesion occurred was changed as represented by 14 in FIG. 12. That is, this shows that addition of ethanolamine can prevent the adhesion which occurs at a given pH.

Figure 13:
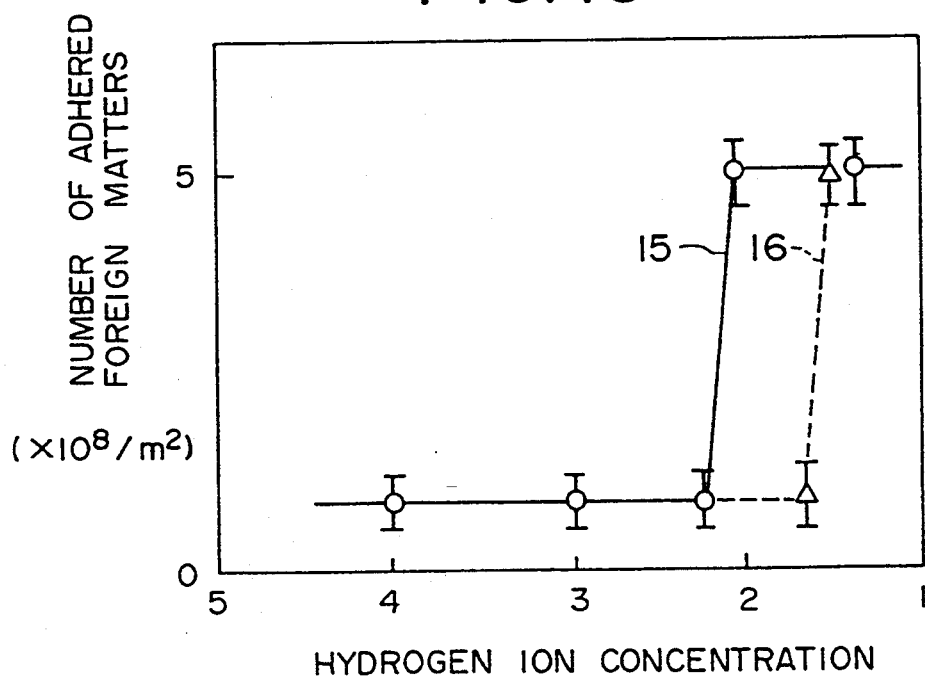

Then, a similar adhesion experiment was conducted by using polystyrene standard particles of 1.0 μm. An optical microscope was used to measure the number of the adhered particles. Since adhesion of the 1.0 μm particles was hardly seen, the experiment was conducted by adding chloric acid to adjust the concentration of the hydrogen ions in the solution. The concentration of polystyrene particles were $5 \times 10^{13}/m^3$ and the wafer was immersed in the solution for 10 minutes. When the acidity exceeds about pH 2.2 as shown by 15 in FIG. 13, the 1.0 μm particles tend to adhere to the wafer. When $6 \times 10^{-5}\%$ by volume of ethanolamine was added, the hydrogen ion concentration at which adhesion takes place was changed. This shows that the addition of ethanol amine can prevent adhesion of particles which occurs at a given pH, that is, that adhesion can be prevented in a range at which the acidity is higher.

There is also the same effect in the alkaline range. The addition of ethanol amine enables the range at which adhesion occurs to be shifted to a higher alkaline range.

Figure 14:
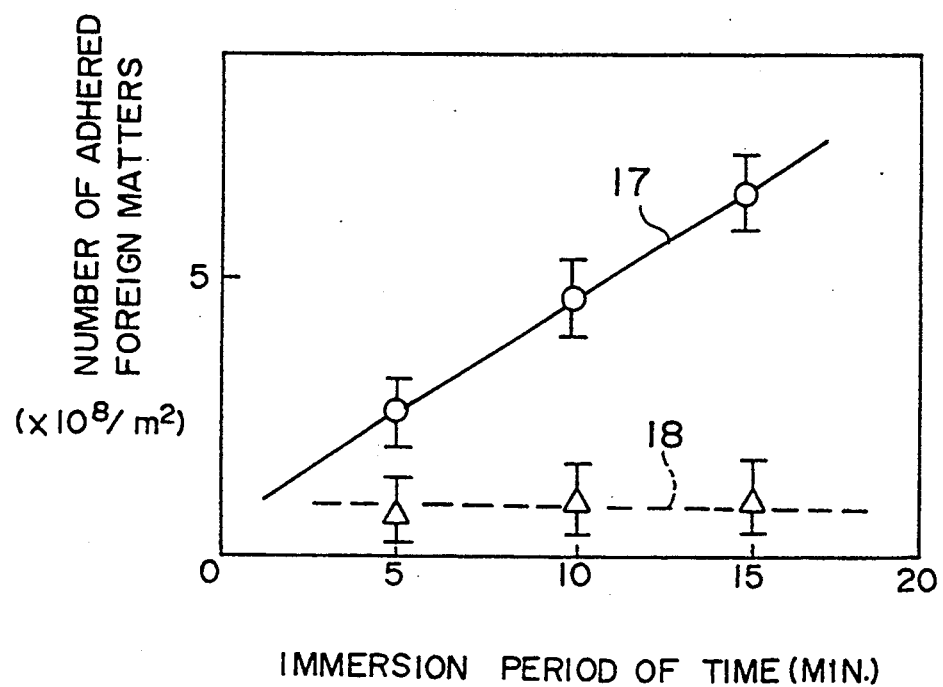
FIG. 14 is a graph showing the relation between the period of wafer immersion time and the number of adhered particles.

A similar adhesion experiment was then conducted by preparing a solution containing hydrofluoric acid and ultrapure water at a ratio of 1:99 for dispersing Si particles having a diameter of 1 μm. The concentration of the Si particles was adjusted to $5 \times 10^{13}/m^3$. It was found that the number of adhered particles increases as the length of the immersion period increases, as is represented by 17 in FIG. 14. A similar adhesion experiment was conducted after $10^{-6}$ mol/l the nonionic surface active agent which was used in Example 7 and $6 \times 10^{-5}\%$ by volume of ethanolamine were added. A obtained result is also represented by 18 in FIG. 14. Little adhesion was seen.

Figure 15:
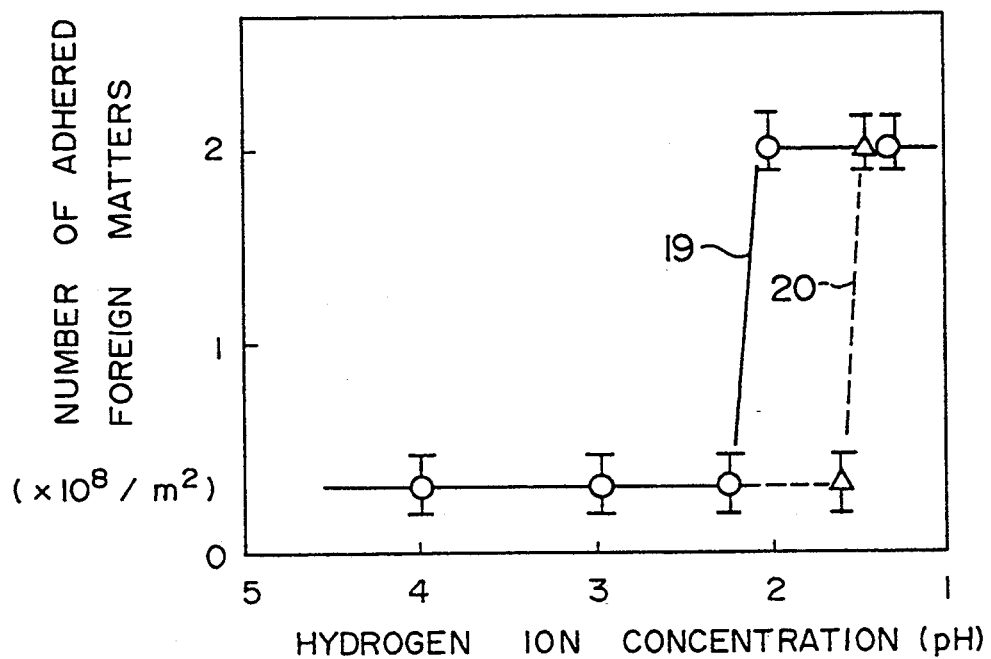
FIGS. 15 through 18 are graphs showing the relation between the hydrogen ion concentration and the number of adhered particles.

A similar adhesion experiment was conducted by dispersing Si particles having a diameter of 1 μm in ultrapure water. The Si particles were not treated with hydrofluoric acid and the concentration of the Si particles was adjusted to $5 \times 10^{13}/m^3$. The wafer was immersed for 10 minutes. When the acidity exceeds about pH 2.2 as represented by 19 in FIG. 15, the 1 μm particles tend to adhere to the wafer. When $10^{-6}$ mol/l of the nonionic surface active agent and $6 \times 10^{-5}\%$ by volume of ethanolamine were added, the hydrogen ion concentration at which adhesion occurs changed to the higher acidic side. That is, it has been found that the addition of ethanolamine can prevent the adhesion which occurs at a given pH.

Figure 16:
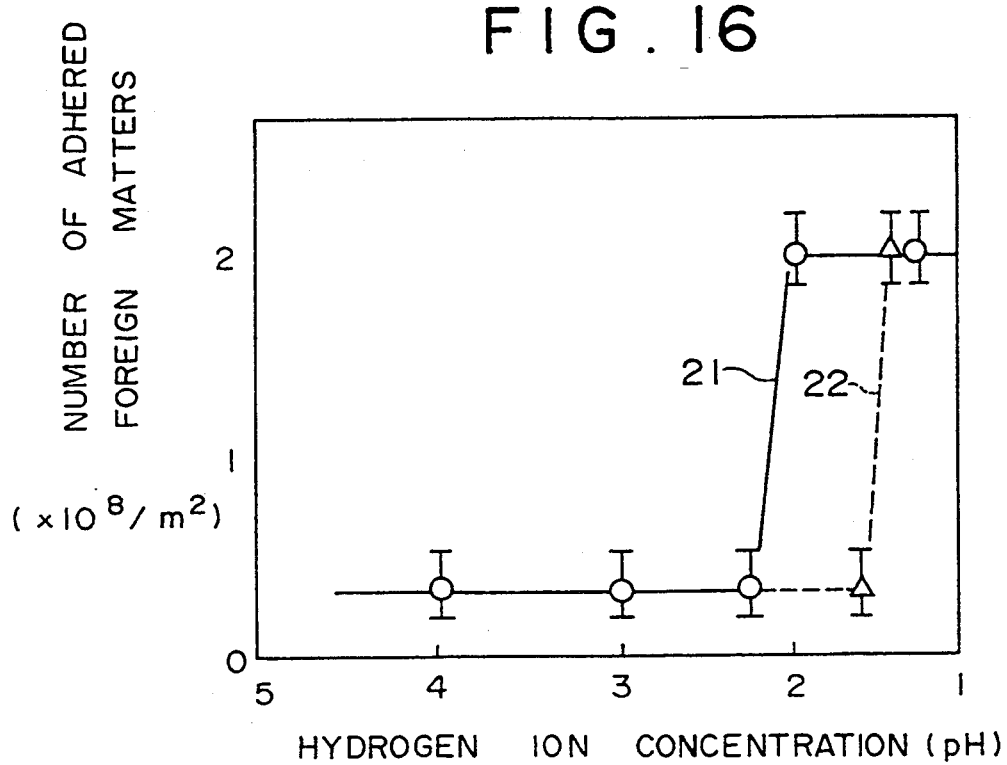

A similar adhesion experiment was then conducted by dispersing $SiO_2$ particles having a diameter of 1 μm in ultrapure water. The concentration of the $SiO_2$ particles was adjusted to $5 \times 10^{13}/m^3$ and the wafer was immersed for ten minutes. When the acidity exceeds about pH 2.2, the 1 μm particles tend to adhere to the wafer as represented by 21 in FIG. 16. When $10^{-6}$ mol/l of the nonionic surface active agent which was used in Example 7 and $6 \times 10^{-5}\%$ by volume of ethanol amine were added, the hydrogen ion concentration at which adhesion occurs changed to the higher acidic side as represented by 22 in FIG. 16. It has been found that adhesion which occurs at a given pH can be prevented by the addition of ethanolamine.

Figure 17:
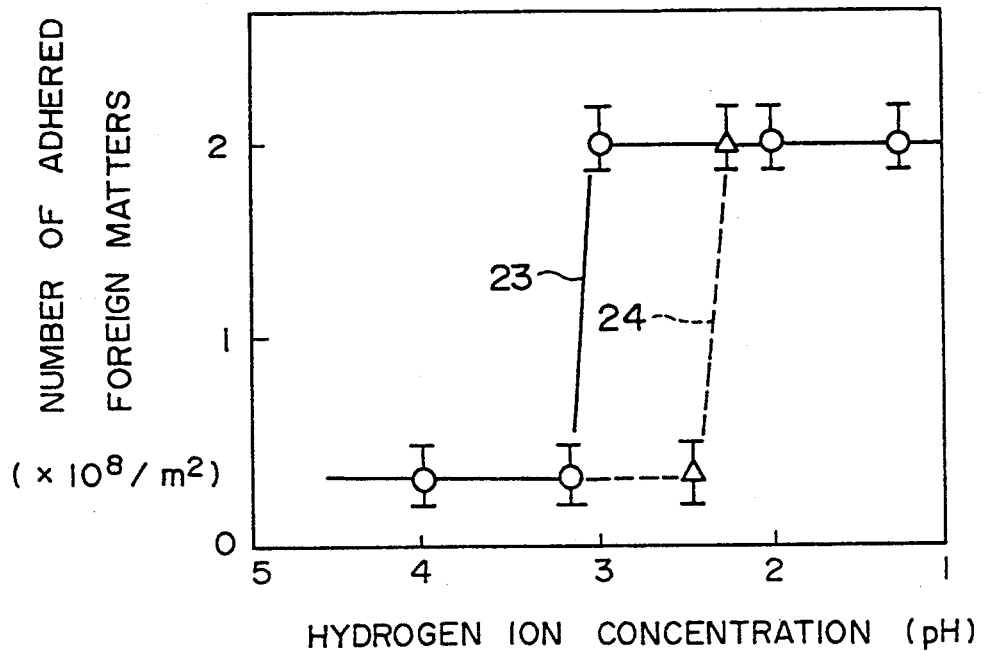

A similar adhesion experiment was conducted by dispersing Fe particles having a diameter of 1 μm in ultrapure water. The concentration of the Fe particles was adjusted to $5 \times 10^{13}/m^3$ and the wafer was immersed for 10 minutes. When the acidity exceeds about pH 3, the 1 μm particles tend to adhere. When $10^{-6}$ mol/l of the nonionic surface active agent which was used in Example 7 and $6 \times 10^{-5}\%$ by volume of ethanolamine were added, the hydrogen concentration at which adhesion occurs changed as represented by 24 in FIG. 17. It has been found that the adhesion which occurs at a given pH can be prevented by the addition of ethanolamine.

Figure 18:
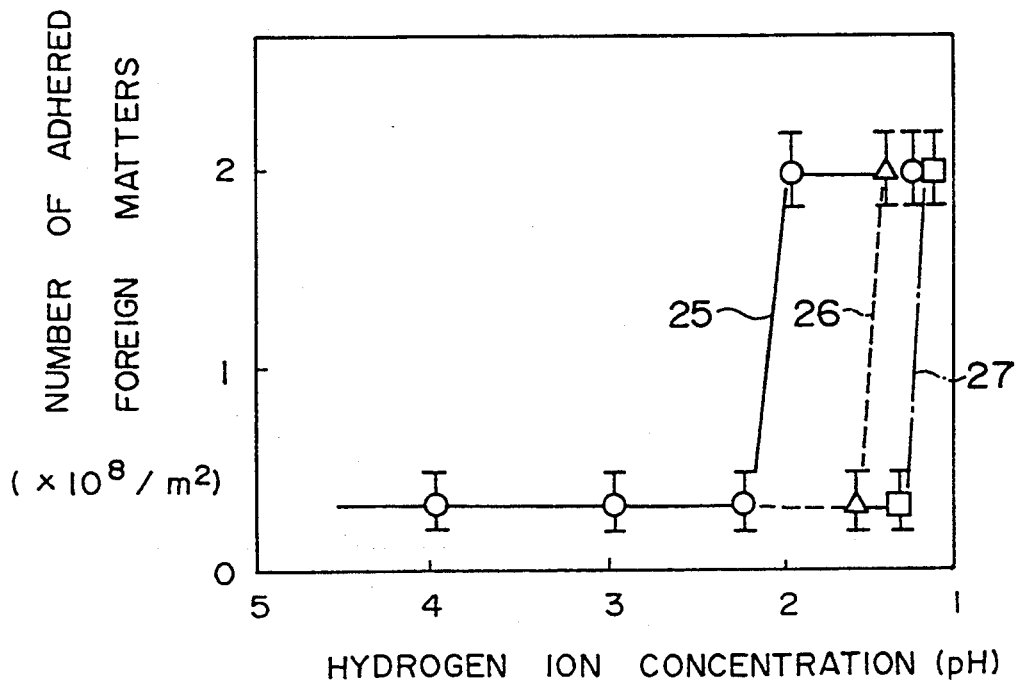

The relation between the amount of added ethanol amine and the adhesion preventive effect was studied. A similar adhesion experiment was conducted by dispersing 1 μm polystyrene particles. The concentration of the polystyrene particles was adjusted to $5 \times 10^{13}/m^3$. The wafer was immersed for 10 minutes. When the acidity exceeds about pH 2.12, the 1 μm particles tend to adhere as represented by 25 in FIG. 18. When $6 \times 10^{-5}\%$ by volume of ethanolamine was added, the hydrogen ion concentration at which adhesion occurs changed as represented by 26 in FIG. 18. When the $6 \times 10^{-3}\%$ by volume of ethanolamine was added, the hydrogen ion concentration at which adhesion occurs further decreased as represented as 27 in FIG. 18. It has been found that a more remarkable adhesion preventive effect is obtained. It can be considered that an increase in the amount of added ethanolamine increases the absolute value of the zeta potential of a foreign material so that the adhesion prevention effect correspondingly become more remarkable. Accordingly, a similar effect can be expected for the other particles by increasing the addition amount.

It has been proven from the fore-going adhesion experiments that the control of the zeta potential described herein is effective to prevent or reduce adhesion of fine particles.

EXAMPLE 9

Figure 19:
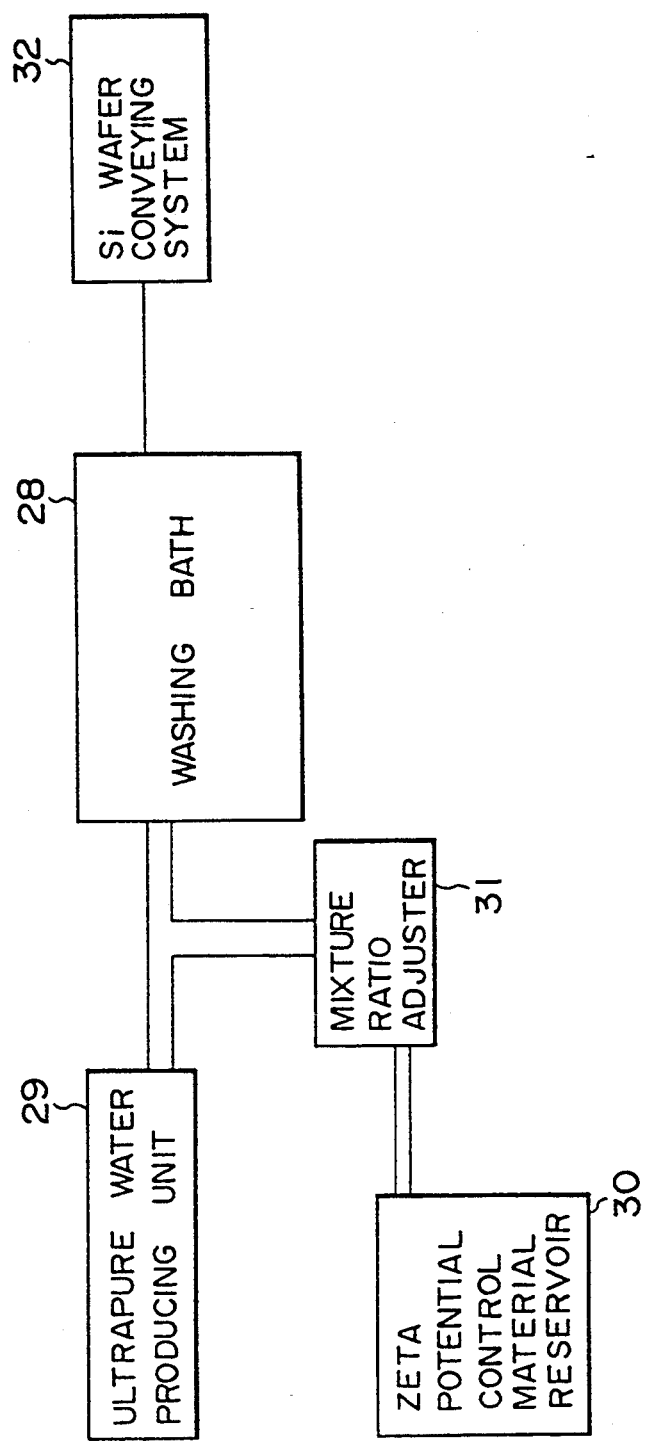
FIG. 19 is a schematic view showing an embodiment of a washing system of the present invention.

An example of a washing system embodying the present invention is illustrated in FIG. 19. As shown in FIG. 19, ultrapure water produced in a ultrapure water producing unit 29 and a zeta potential control material supplied from a zeta potential control material reservoir 30 via a mixture ratio adjuster 31 are fed to a washing bath 28 and are mixed with each other and the mixture is used for washing Si wafers which are conveyed from an Si wafer conveying system 32 to the washing bath.

TABLE 1

ZETA POTENTIAL CONTROL EFFECT OBTAINED BY ADDITION OF VARIOUS MATERIALS

| MATERIALS | EFFECTIVE ADDITION AMOUNT (% BY VOL.) | OPTIMUM ADDITION RANGE (% BY VOL.) | OPTIMUM ADDITION AMOUNT AND ZETA POTENTIAL (mV) | | |
|---|---|---|---|---|---|
| | | | ADDITION AMOUNT (% BY VOL.) | POLYSTYRENE PARTICLES | SI PARTICLES |
| METHYL ALCOHOL | <25 | 0.1–1.0 | 0.5 | −57.2 | −40.5 |
| ETHYL ALCOHOL | " | 0.1–1.0 | 0.5 | −62.1 | −50.1 |
| i-PROPYL ALCOHOL | " | 0.1–1.0 | 1.0 | −61.0 | −46.5 |
| n-PROPYL ALCOHOL | " | 0.1–2.0 | 1.0 | −53.0 | −28.8 |
| n-BUTYL ALCOHOL | " | 0.1–1.0 | 0.5 | −52.1 | −24.1 |
| sec-BUTYL ALCOHOL | " | 0.1–1.0 | 0.5 | −58.0 | −41.4 |
| n-AMYL ALCOHOL | " | 0.1–1.0 | 0.5 | −53.1 | −30.5 |
| ALLYL ALCOHOL | " | 0.1–2.0 | 1.0 | −52.9 | −25.2 |
| POLYVINYL ALCOHOL | " | 0.1–1.0 | 0.5 | −52.8 | −25.3 |

TABLE 1-continued

ZETA POTENTIAL CONTROL EFFECT OBTAINED BY
ADDITION OF VARIOUS MATERIALS

| MATERIALS | EFFECTIVE ADDITION AMOUNT (% BY VOL.) | OPTIMUM ADDITION RANGE (% BY VOL.) | OPTIMUM ADDITION AMOUNT AND ZETA POTENTIAL (mV) | | |
|---|---|---|---|---|---|
| | | | ADDITION AMOUNT (% BY VOL.) | POLYSTYRENE PARTICLES | SI PARTICLES |
| ETHYLENE GLYCOL | " | 0.1–2.5 | 1.0 | −55.0 | −33.7 |
| TRIMETHYL GLYCOL | " | 0.1–1.0 | 0.5 | −54.2 | −33.0 |
| PROPYLENE GLYCOL | " | 0.1–1.0 | 0.5 | −52.0 | −24.3 |
| 1,3-PROPANEDIOL | " | 0.1–1.0 | 0.5 | −54.4 | −33.0 |
| ACETALDEHYDE | " | 0.1–1.0 | 0.5 | −53.0 | −26.7 |
| ACETIC ACID | " | 0.001–0.1 | 0.005 | −53.5 | −31.1 |
| METHYL ACETATE | " | 0.1–3.5 | 2.0 | −56.3 | −35.3 |
| ACETONE | " | 0.1–3.0 | 2.0 | −52.6 | −25.5 |
| GLYCERYC MONOCAPRYLATE | " | 0.1–1.0 | 0.5 | −52.9 | −25.0 |
| NO ADDITION | — | — | — | −50.4 | −23.7 |

* Measured after lapse of one minute since immersion into mixture including HF and $H_2O$ at a ratio of 1:99.

TABLE 2

ZETA POTENTIAL CONTROL EFFECT OBTAINED BY
ADDITION OF AMINO ALCOHOL

| MATERIALS | EFFECTIVE ADDITION AMOUNT (% BY VOL.) | OPTIMUM ADDITION RANGE (% BY VOL.) | AN EXAMPLE OF ZETA POTENTIAL (mV) IN OPTIMUM ADDITION RANGE | | |
|---|---|---|---|---|---|
| | | | ADDITION AMOUNT (% BY VOL.) | POLYSTYRENE PARTICLES | SI PARTICLES |
| MONOETHANOLAMINE | $>10^{-9}$ | $10^{-7}$–$10^{-1}$ | $6 \times 10^{-5}$ | −71.3 | −66.1 |
| DIETHANOLAMINE | " | " | $9 \times 10^{-5}$ | −63.2 | −59.2 |
| TRIETHANOLAMINE | " | " | $1.2 \times 10^{-4}$ | −59.0 | −52.1 |
| 2-DIMETHYL AMINOETHANOL | " | " | $9 \times 10^{-5}$ | −68.5 | −64.1 |
| MONOISOPROPANOLAMINE | " | " | $7.5 \times 10^{-5}$ | −70.1 | −65.0 |
| DI-ISOPROPANOLAMINE | " | " | $1.1 \times 10^{-4}$ | −67.3 | −61.0 |
| TRI-ISOPROPANOLAMINE | " | " | $1.3 \times 10^{-4}$ | −66.2 | −60.1 |
| NO ADDITION | — | — | — | −50.4 | −23.7 |

* Measured after lapse of one minute since immersion into mixture including HF and $H_2O$ at a ratio of 1:99.

TABLE 3

ZETA POTENTIAL CONTROL EFFECT OBTAINED BY
ADDITION OF ALCOHOL INCLUDING HALOGEN

| MATERIALS | EFFECTIVE ADDITION AMOUNT (% BY VOL.) | OPTIMUM ADDITION RANGE (% BY VOL.) | OPTIMUM ADDITION AMOUNT AND ZETA POTENTIAL (mV) | | |
|---|---|---|---|---|---|
| | | | ADDITION AMOUNT (% BY VOL.) | POLYSTYRENE PARTICLES | SI PARTICLES |
| $(CF_3)_2CHOH$ | <25 | 0.1–1.0 | 0.5 | −61.1 | −54.6 |
| $DF_3DF_2DH_2OH$ | " | 0.1–1.0 | 0.5 | −54.8 | −32.0 |
| $(CF_3)_2CHOH$ | " | 0.01–0.5 | 0.04 | −52.0 | −28.5 |
| NO ADDITION | — | — | — | −50.4 | −23.7 |

* Measured after lapse of one minute since immersion into mixture including HF and $H_2O$ at a ratio of 1:99.

TABLE 4

ZETA POTENTIAL CONTROL EFFECT OBTAINED BY
NONIONIC SURFACE ACTIVE AGENT

| NUMBER OF Ns IN VENERAL FORMULA OF SURFACE ACTIVE AGENT | ADDITION AMOUNT | ZETA POTENTIAL (mV) | | | | |
|---|---|---|---|---|---|---|
| | | POLYSTYLENE PARTICLES (% BY VOL.) | $SiO_2$ PARTICLES | Fe PARTICLES | SI* PARTICLES | SI** PARTICLES |
| n = 9 | | −75.2 | −72.3 | −65.0 | −74.2 | −64.2 |
| n = 11 | $10^{-6}$ mol/l | −74.1 | −71.5 | −64.2 | −73.8 | −63.8 |
| n = 13 | | −75.0 | −71.4 | −64.8 | −71.0 | −64.1 |
| n = 9 | | −70.1 | −69.1 | −62.1 | −72.0 | −61.2 |
| n = 11 | $10^{-6}$ mol/l | −70.2 | −69.2 | −61.9 | −70.2 | −60.8 |
| n = 13 | | −71.0 | −68.3 | −61.9 | −69.2 | −61.0 |

TABLE 4-continued

ZETA POTENTIAL CONTROL EFFECT OBTAINED BY NONIONIC SURFACE ACTIVE AGENT

| NUMBER OF Ns IN VENERAL FORMULA OF SURFACE ACTIVE AGENT | ADDITION AMOUNT | ZETA POTENTIAL (mV) | | | | |
|---|---|---|---|---|---|---|
| | | POLYSTYRENE PARTICLES (% BY VOL.) | SiO2 PARTICLES | Fe PARTICLES | SI* PARTICLES | Si** PARTICLES |
| NO ADDITION | — | −50.4 | −37.8 | −25.6 | −43.1 | −23.7 |

*Not treated
**Measured after lapse of one minute since immersion into mixture including HF and $H_2O$ at a ratio of 1:99.

SURFACE ACTIVE AGENT: $CH_3CH_2CH-R-O(CH_2CH_2O)_{12}$
                                          |
                                         OH (R: $-(CH_2)_n-$, n is 5-20)

TABLE 5

ZETA POTENTIAL CONTROL EFFECT OBTAINED BY ADDITION OF TWO KINDS OF NONIONIC SURFACE ACTIVE AGENTS

| SURFACE ACTIVE AGENTS | ADDITION AMOUNT | ZETA POTENTIAL (mV) | | | | |
|---|---|---|---|---|---|---|
| | | POLYSTYRENE PARTICLES | SiO2 PARTICLES | Fe PARTICLES | SI* PARTICLES | Si** PARTICLES |
| SURFACE ACTIVE AGENT | I ... $10^{-5}$ mol/l<br>II ... $5 \times 10^{-8}$ mol/l | −63.1 | −50.5 | −41.1 | −55.1 | −38.1 |
| SURFACE ACTIVE AGENT | I ... $10^{-5}$ mol/l<br>II ... $10^{-7}$ mol/l | −65.1 | −52.1 | −42.1 | −58.2 | −40.1 |
| SURFACE ACTIVE AGENT | I ... $10^{-5}$ mol/l<br>II ... $5 \times 10^{-7}$ mol/l | −64.2 | −50.1 | −40.5 | −56.4 | −38.4 |
| NO ADDITION | | −50.4 | −37.8 | −25.6 | −43.1 | −23.7 |

*Not treated
**Measured after lapse of one minute since immersion into mixture including HF and $H_2O$ at a ratio of 1:99.
SURFACE ACTIVE AGENT I: $CH_3(CH_2)_{11}CH_2O(CH_2CH_2O)_{12}H$
SURFACE ACTIVE AGENT II: $CH_3(CH_2)_{12}CH_2O(CH_2CH_2O)_{14}H$

TABLE 6

ZETA POTENTIAL CONTROL EFFECT OBTAINED BY ADDITION OF TWO KINDS OF NONIONIC SURFACE ACTIVE AGENTS AND ALCOHOL

| SURFACE ACTIVE AGENTS + ALCOHOL | ADDITION AMOUNT | ZETA POTENTIAL (mV) | | | | |
|---|---|---|---|---|---|---|
| | | POLYSTYRENE PARTICLES | SiO2 PARTICLES | Fe PARTICLES | SI** PARTICLES | Si** PARTICLES |
| SURFACE ACTIVE AGENT<br>ETHANOL | $10^{-6}$ mol/l<br>0.5% by vol. | −59.8 | −45.2 | −34.0 | −48.8 | −33.3 |
| SURFACE ACTIVE AGENT<br>ETHANOL | $10^{-6}$ mol/l<br>1% by vol. | −60.0 | −47.9 | −34.2 | −52.2 | −33.7 |
| SURFACE ACTIVE AGENT<br>ETHANOL | $10^{-7}$ mol/l<br>0.5% by vol. | −61.1 | −49.1 | −37.0 | −54.1 | −36.8 |
| SURFACE ACTIVE AGENT<br>ETHANOL | $10^{-7}$ mol/l<br>1% by vol. | −60.2 | −48.2 | −35.2 | −53.0 | −34.2 |
| NO ADDITION | | −50.4 | −37.8 | −25.6 | −43.1 | −23.7 |

*Not treated
**Measured after lapse of one minute since immersion into mixture including HF and $H_2O$ at a ratio of 1:99.
SURFACE ACITVE AGENT: $CH_3(CH_2)_{10}CH_2O(CH_2CH_2O)_{12}H$

TABLE 7

ZETA POTENTIAL CONTROL EFFECT OBTAINED BY ADDITION OF NONIONIC SURFACE ACTIVE AGENT AND AMINO ALCOHOL

| SURFACE ACTIVE AGENTS + AMINO ALCOHOL | ADDITION AMOUNT | ZETA POTENTIAL (mV) | | | | |
|---|---|---|---|---|---|---|
| | | POLYSTYRENE PARTICLES | SiO2 PARTICLES | Fe PARTICLES | SI* PARTICLES | Si** PARTICLES |
| SURFACE ACTIVE AGENT<br>ETHANOLAMINE | $10^{-6}$ mol/l<br>$6 \times 10^{-5}$ % by vol. | −65.2 | −69.8 | −62.1 | −57.2 | −61.7 |

TABLE 7-continued

ZETA POTENTIAL CONTROL EFFECT OBTAINED BY ADDITION OF NONIONIC SURFACE ACTIVE AGENT AND AMINO ALCOHOL

| SURFACE ACTIVE AGENTS + AMINO ALCOHOL | ADDITION AMOUNT | ZETA POTENTIAL (mV) | | | | |
|---|---|---|---|---|---|---|
| | | POLYSTYRENE PARTICLES | SiO2 PARTICLES | Fe PARTICLES | SI* PARTICLES | Si** PARTICLES |
| SURFACE ACTIVE AGENT | $10^{-6}$ mol/l | −71.2 | −76.0 | −61.8 | −81.5 | −64.0 |
| ETHANOLAMINE | $6 \times 10^{-4}$ % by vol. | | | | | |
| SURFACE ACTIVE AGENT | $10^{-7}$ mol/l | −63.0 | −68.2 | −60.3 | −55.0 | −59.8 |
| ETHANOLAMINE | $6 \times 10^{-5}$ % by vol. | | | | | |
| SURFACE ACTIVE AGENT | $10^{-7}$ mol/l | −70.5 | −74.5 | −60.0 | −80.0 | −61.2 |
| ETHANOLAMINE | $6 \times 10^{-4}$ % by vol. | | | | | |
| SURFACE ACTIVE AGENT | $10^{-6}$ mol/l | −64.8 | −68.6 | −62.0 | −58.1 | −60.8 |
| ISOPROPANOLAMINE | $7.5 \times 10^{-5}$ % by vol. | | | | | |
| SURFACE ACTIVE AGENT | $10^{-6}$ mol/l | −72.1 | −75.2 | −60.9 | −80.9 | −63.6 |
| ISOPROPANOLAMINE | $7.5 \times 10^{-4}$ % by vol. | | | | | |
| SURFACE ACTIVE AGENT | $10^{-7}$ mol/l | −62.8 | −67.6 | −59.9 | −54.8 | −59.2 |
| ISOPROPANOLAMINE | $7.5 \times 10^{-5}$ % by vol. | | | | | |
| SURFACE ACTIVE AGENT | $10^{-7}$ mol/l | −71.0 | −73.8 | −60.1 | −79.1 | −60.9 |
| ISOPROPANOLAMINE | $7.5 \times 10^{-4}$ % by vol. | | | | | |
| NO ADDITION | | −50.4 | −37.8 | −25.6 | −43.1 | −23.7 |

*Not treated
**Measured after lapse of one minute since immersion into mixture including HF and H2O at a ratio of 1:99.
SURFACE ACTIVE AGENT: CH3(CH2)10CH2O(CH2CH2O)12H Since adhesion of fine particles in liquid can be reduced in accordance with the present invention, the yield of electronic components such as semiconductor devices, thin film devices and discs can be enhanced so that the above mentioned products can be manufactured at a lower cost.

The present invention not only contemplates the prevention of fine particles (foreign materials) from adhering to semiconductor substrates and the like, but also the prevention of the particles from re-adhering upon washing of the substrates.

What is claimed is:

1. A method of controlling the adhesion of fine particles to an object in a solution characterized in that adhesion of fine particles in the solution is prevented or reduced by adding into the solution a material, which is capable of controlling the zeta potential (surface potential) of the fine particles and is unlikely to be ionized, in the amount of $10^{-7}$ to 25% by volume.

2. A method of controlling the adhesion of fine particles to an object in a solution as set forth in claim 1 in which the material which is capable of controlling the zeta potential of the fine particles in the solution and is unlikely to be ionized has a dipole moment.

3. A method of controlling the adhesion of fine particles to an object in a solution as set forth in claim 1 in which the material which is capable of controlling the zeta potential of the fine particles in the solution and is unlikely to be ionized has hydrophilic and hydrophobic groups in one molecule.

4. A method of controlling the adhesion of fine particles to an object in a solution as set forth in claim 1 in which the material which is capable of controlling the zeta potential of the fine particles in the solution and is unlikely to be ionized includes molecules in which the charge distribution of any one of second to sixth atoms from the terminal or a plurality of atoms is negative.

5. A method of controlling the adhesion of fine particles to an object in a solution as set forth in claim 3 in which the material having hydrophilic and hydrophobic groups in one molecule is a material in which a part or all of hydrogen atoms of the hydrophobic group are substituted with halogen atoms.

6. A method of controlling the adhesion of fine particles to an object in a solution as set froth in claim 1 in which the material which is capable of controlling the zeta potential of the fine particles in the solution and is unlikely to be ionized has amino and hydroxyl groups in one molecule.

7. A method of controlling the adhesion of fine particles to an object in a solution as set forth in claim 2 which is carried out by adding not less than 2 kinds of materials having different molecular lengths.

8. A method of controlling the adhesion of fine particles to an object in a solution as set forth in claim 1 which is carried out by adding at least one kind of nonionic surface active agents and a material having hydrophilic and hydrophobic groups in one molecule.

9. A method of controlling the adhesion of fine particles to an object in a solution as set forth in claim 1 in which the object to which the particles adhere is a semiconductor substrate.

10. A method of controlling the adhesion of fine particles to an object in a solution as set forth in claim 1 in which the material, which is capable of controlling the zeta potential of the fine particles in the solution and is unlikely to be ionized, is at lest one selected from the group consisting of alcohols, aldehydes, ketones, esters, organic acids, amines, amino alcohols, and alcohols which contain halogen.

11. A method of controlling the adhesion of fine particles to an object in a solution as set forth in claim 1 in which the material, which is capable of controlling the zeta potential of the fine particles in the solution and is unlikely to be ionized, is at least one selected from the group consisting of methyl alcohol, ethyl alcohol, i-propyl alcohol, n-propyl alcohol, n-butyl alcohol, sec-butyl alcohol, n-amyl alcohol, allyl alcohol, polyvinyl alcohol, ethylene glycol, trimethyl glycol, propylene glycol, 1,3-propanediol, acetalehyde, acetic acid, methyl acetate, acetone, glyceryc monocaprylate, monoethanolamine, diethanolamine, triethanolamine, 2-diemethyl-aminoethanol, monoisopropanolamine, diisopropanolamine, tri-isopropanolamine, hexafluoro-2-propanol and pentafluoropropanol.

* * * * *